United States Patent [19]
Dudas et al.

[11] Patent Number: 5,519,577
[45] Date of Patent: May 21, 1996

[54] SPREAD SPECTRUM RADIO INCORPORATED IN A PCMCIA TYPE II CARD HOLDER

[75] Inventors: Errol Dudas, San Jose; Tom Hutton, Cupertino; Norm Nelson, Sunnyvale; Pat Wallace, San Jose, all of Calif.

[73] Assignee: Symbol Technologies, Inc., Bohemia, N.Y.

[21] Appl. No.: 173,249

[22] Filed: Dec. 23, 1993

[51] Int. Cl.$^6$ .............................. H05K 1/11; H05K 5/02; H05K 5/04; H05K 9/00
[52] U.S. Cl. ................. 361/737; 174/35 R; 174/35 GC; 361/752; 361/753; 361/755; 361/757; 361/777; 361/792; 361/794; 361/814; 361/816; 361/818; 455/347; 455/351; 455/89; 455/90
[58] Field of Search ............................ 174/35 R, 35 TS, 174/35 GC, 51, 255; 235/488, 489, 490, 492, 1 D; 257/678; 361/212, 220, 684, 737, 686, 753, 755, 780, 792, 793–795, 816, 818; 439/607, 609; 455/90, 106, 300, 311, 303, 347, 348, 349; 343/880–882, 841, 887, 878, 872

[56] References Cited

U.S. PATENT DOCUMENTS

| | | | |
|---|---|---|---|
| 4,498,122 | 2/1985 | Rainal | 174/255 |
| 4,658,334 | 4/1987 | McSparran et al. | 174/35 R |
| 4,902,610 | 2/1990 | Shipley | 430/312 |
| 5,029,183 | 7/1991 | Tymes | 375/1 |
| 5,117,069 | 5/1992 | Higgins, III | 156/902 |
| 5,142,550 | 8/1992 | Tymes | 375/1 |
| 5,183,404 | 2/1993 | Aldous et al. | 439/55 |
| 5,234,351 | 8/1993 | Dixon | 439/160 |
| 5,246,817 | 9/1993 | Shipley, Jr. | 430/312 |
| 5,315,069 | 5/1994 | Gebara | 174/255 |
| 5,373,149 | 12/1994 | Rasmussen | 361/686 |

FOREIGN PATENT DOCUMENTS

| | | | |
|---|---|---|---|
| 504020 | 9/1992 | European Pat. Off. | 361/818 |
| 1-98299 | 4/1989 | Japan | 361/818 |
| 4-116899 | 4/1992 | Japan | 361/818 |
| 5-191073 | 7/1993 | Japan | 361/818 |

*Primary Examiner*—Donald A. Sparks
*Attorney, Agent, or Firm*—Kevin E. McDermott

[57] ABSTRACT

This invention is directed to a PCMCIA Type II memory card holder assembly for a spread spectrum radio communication card that provides radio frequency interference shielding, electrostatic discharge resistance and heat dissipation. The card holder assembly consists of a multilayer circuit board and a card holder. The multilayer circuit board has a ground plane disposed between a plurality of analog circuit layers and a plurality of digital circuit layers. The ground plane is connected by through vias to ground traces on the surfaces of the circuit board. The card holder consists of a card holder frame in which the memory card is slidably and rotatably mounted so that the ground traces continuously contact the frame, and two outer cover plates which are adhered to the opposing surfaces of the card holder frame.

34 Claims, 5 Drawing Sheets

FGI. 1

SPREAD SPECTRUM RADIO INCORPORATED IN A PCMCIA TYPE II CARD HOLDER

BACKGROUND OF THE INVENTION

Advancements in electronics technology have allowed electronic equipment, such as computers, to be downsized to facilitate portability. This downsizing has resulted in internal spatial restrictions that have created a need for the establishment of standards for the component devices in the electronic equipment.

The Personal Computer Memory Card International Association (PCMCIA), an organization comprised of hundreds of manufacturers of memory cards and related peripheral equipment, has established spatial standards for all circuit boards used in downsized computers. PCMCIA has developed a 68-pin memory card standard for three memory card types as follows:

a. Type I Memory Cards are the same width and length as a common credit card, about 54 mm×85.6 mm, but are thicker than a credit card. The thickness of a Type I card is 3.3 mm (0.130").

b. Type II Memory Cards are used by those companies which are utilizing memory components that are too high to be housed within a Type I card. Type II memory cards are also the same overall length and width as credit cards, but have a raised body cross section in the substrate area which gives them an overall thickness of 5 mm (0.195"). The raised substrate areas of these cards are 48 mm in width.

c. Type III Memory Card are the result of a recent movement sponsored by the Small Form Factor Committee to enable 1.8" Small Form Factor Disk Drives to be plugged into memory card connectors in small portable computer applications. Type III memory cards are the same length and width as Type I and Type II memory cards. However, Type III cards have a substrate area thickness of 10.5 mm. Also, Type III memory cards require a card guide opening width of 51 mm on the header connector to accommodate the slightly wider raised substrate area.

By complying with the standards established by PCMCIA for memory cards, card manufacturers of peripheral devices, such as communication cards, have assured themselves of compatibility and spatial conformity with computers and other electronic devices that conform to the new PCMCIA standards. The size and shape of the circuit board holder of the present invention complies with the PCMCIA Type II memory card standards. The standard 68-pin connector is plugged into a keyed plug connector on a computer or electronic device and the dimensions of the card holder frame and covers are standard for Type II cards. However, the novel grounding, heat sinking and electrostatic discharge resistance features of the present invention are not limited to PCMCIA Type II memory cards and can be used for PCMCIA Type I and Type III memory cards as well as other circuit boards for computer or electronic devices.

Bar code scanners are widely used at check-out counters in supermarkets, department stores and almost every other business where a cash register is employed. The scanners are typically mounted in either a stationary housing or a hand held "gun" or "wand" that is connected to the computerized register with an electrical cord. A major limitation with these scanners is that they are tethered to the register and cannot be used outside of a short distance from a relatively fixed location. This limitation has created a long felt need in the bar code industry for portable bar code scanners. The present invention meets this need by providing a portable bar code scanner that interfaces with a cash register or other computerized device by radio communication.

The present invention provides for a PCMCIA Type II card holder with a circuit board for a spread spectrum radio communicator that overcomes all Radio Frequency Interference (RFI) shielding, Electrostatic Discharge (ESD) resistance and heat-sinking problems encountered by typical prior art devices. However, this memory card holder is not limited to spread spectrum communicators and may be used for various types of memory cards and circuit boards. The present invention is specifically designed to provide radio communication between portable bar-code scanners and other data collecting and/or generating devices through a local-area network to a computer. This satisfies a long felt need for communications between a portable scanner and other similar devices and a stationary computer. Such time consuming tasks as taking inventory in a warehouse or other facility are made simpler, easier and faster by the present invention. The present invention, when used with a local-area network installed within the facility, enables a scanner or other device to communicate directly with the computer that manages the inventory. Other uses include monitoring articles as they enter and leave an area and tracking manufacturing production by monitoring articles at various stages of the production process.

In the prior art, communication was typically accomplished by hard-wired interconnection between a remote device and a computer or by connecting an external radio communicator to the portable device for communication with the computer. Integrally mounting a radio communicator in a portable device required elaborate shielding methods since the proximity of other electronic components in the spatially restricted housings resulted in the disruption of the radio communication signal. In addition to the digital noise generated from within the housing, these radio communicators also were susceptible to disruption from external noise. These problems were not successfully overcome by typical prior art communicators because the spatial restrictions did not permit adequate room for shielding and grounding.

SUMMARY OF THE INVENTION

One object of the present invention is to overcome the problem of disruption of radio communications by providing a radio communicator inside a PCMCIA memory card holder that is completely grounded and shielded from digital noise inside the card holder and from both digital and radio noise outside the card holder. This is accomplished in two ways. First, the entire housing, except for the 68-pin connector, is constructed of conductive materials to shield the radio communicator from external noise. Second, the radio communicator circuit board is divided into a radio side and a digital side which are electrically shielded from each other by a ground plane disposed between the two sides and by the configuration of the inner planes of the circuit board and their blind vias.

In the present invention, a radio communicator is used in the memory card holder. However, other circuit boards may also be used in the memory card holder with the same beneficial results. The radio communicator used herein is a 915 megahertz or 2.4 gigahertz spread spectrum radio that is well known to those skilled in the art of spread spectrum communication. U.S. Pat. Nos. 5,029,183 and 5,142,550 disclose such communicators and are hereby incorporated by reference herein.

Another object of the present invention is to provide a card holder assembly that is capable of housing a circuit board with analog and digital circuits so that the analog and digital circuits are in separate compartments that are electronically shielded from each other and from outside electronic noise. The card holder assembly comprises an upper cover plate and a lower cover plate, a card holder frame and a circuit board. Positioned between the upper cover plate and lower cover plate is the card holder frame. Mounted in the frame is a circuit board with a connector on one end for insertion in a PCMCIA plug connector. Adjacent to the interior side of each cover plate is a sheet of mounting tape to which is adhered an electrical insulating sheet that extends to at least all of the edges of the circuit board. This insulating sheet prevents the surfaces of the circuit board from contacting the covers.

Another object of the present invention is to provide a layered PCMCIA circuit board having an interior ground plane layer disposed between one or more layers of analog planes on one side and one or more layers of digital planes on the other side. Multilayer circuits enable formation of multiple circuits in minimal volume. They typically comprise a stack of layers with layers of signal lines (conductors) separated from each other by dielectric layers having plated holes known as buried or blind vias providing electrical interconnections between the layers. This technology is disclosed in U.S. Pat. No. 5,117,069 to Higgins and U.S. Pat. No. 5,246,817 to Shipley. As certain specific aspects of this technology is used herein, it is hereby incorporated by reference.

The present invention improves on the existing technology of multilayer circuit board technology by using a ground plane layer in the circuit board to separate analog and digital circuit plane layers disposed on either side of the ground plane. In a preferred embodiment of the present invention, the analog circuit plane layers are used for radio circuits. In conjunction with the ground plane, the present invention uses a plurality of plated through vias to connect the ground plane with a perimeter trace that extends along three edges of the top and bottom surface planes on the circuit board. When the circuit board is mounted in the card frame assembly, the perimeter trace is contacted with the card holder frame and the card holder cover plates with sufficient pressure to permit the conductance of both electricity and heat.

The individual planes of the circuit board that form the layers have a thickness of from about 2 mils to about 10 mils, with a preferred thickness of from about 3 mils to about 5 mils. The overall thickness of the layered structure that forms the circuit board is from about 10 mils to about 200 mils, with a preferred thickness of from about 20 mils to about 50 mils. The most preferred thickness for the circuit board in the present invention is about 31 mils. The planes of the layers are made separately and then laminated together to form the circuit board. This technique is well known to those skilled in the art of multilayer circuit boards.

An object of the present invention is to provide a PCMCIA memory card holder with electrostatic discharge (ESD) resistance. ESD often results when a card is inserted in a computer or other electronic device. A well known method of solving ESD problems is to connect the card ground through the card holder frame to the ground of the device to which it is being mated. This provides a direct shunt path to the mating device as soon as the frame contacts the mating device and prevents electrostatic build-up in the card holder. However, the spatial restrictions of PCMCIA memory card holders have hindered the implementation of this technique in PCMCIA card holder designs. Typical prior art PCMCIA card holders are made with non-conductive plastic frames that do not provide a direct shunt path between the card ground and the equipment chassis ground. Instead, prior art card holders use a connection between the circuit board and the outer cover plates. In many designs, the card holder has to be inserted in the mating plug to almost half its length before the cover plates contact the mating device and a shunt path is created.

The present invention overcomes the PCMCIA card holder spatial constraints by the novel design of the circuit board ground. The circuit board is constructed of multiple layers or planes with the ground plane disposed between the analog circuit planes and the digital circuit planes. The ground plane is then connected to perimeter traces on both surfaces of the circuit board by through vias. When the circuit board is mounted in the electrically conductive card frame and the card holder is inserted in a device, a shunt path is created from the card ground to the chassis of the device. Any electrostatic build-up inside the card holder is thereby shunted to the chassis without affecting the operation of the card or damaging the circuit board.

In addition, the shielded compartments of the card holder protect the components housed therein from external electrostatic discharge. Any external electrostatic discharge in the proximity of the card holder is shunted through the frame to the chassis ground, thereby protecting the circuit board inside the card holder.

Another objective of the present invention is to provide a mounting mechanism that locks the circuit board in the memory card holder so that electricity and heat from the card is conducted to the chassis of the mated device. In addition, the mounting mechanism, by contacting the board on all sides, provides mechanical support for the circuit board. This allows the circuit board to be constructed of thinner and lighter plane materials because the perimeter support provided by the card holder frame replaces the internal structural support provided by thicker planes. This provides more room inside the card holder housing and permits taller components to be mounted on the circuit boards.

The mounting of taller components on the circuit board is also accommodated by having the circuit board positioned at a slight angle in the lengthwise direction (that is from the 68-pin connector end to the opposing end where the connection for an antenna may be located) in relation to the plane formed by the upper and lower surfaces of the card holder frame. By mounting the circuit board at an angle, the distance between the surface of the circuit board and the card holder cover is greater on one lengthwise end than on the other for both the radio and digital sides of the circuit board. This allows the taller components to be located on the end of the board with the greater clearance distance. Accordingly, the radio side of the circuit board has its taller components on the non-connector end of the card holder and the digital side of the circuit board has its taller components on the connector end.

A further object of the present invention is to provide a memory card holder housing that shields the circuit board from all external noise, including both radio frequency noise and digital noise. This is accomplished by constructing the frame and the covers of the card holder of conductive materials and using electrically conductive glue to seal the covers to the frame. This effectively creates two shielded compartments inside the card holder. The radio side of the circuit board is housed in one compartment and the digital side of the circuit board is housed in the other compartment.

The standard PCMCIA Type II covers have a raised portion of the covers to provide increased internal space. The dimensions of this raised portion of the cover are specified in the PCMCIA standard.

The memory card holder is also provided with internal shielding and grounding by the construction of the circuit board and its novel mounting in the card holder. The circuit board is constructed in a layered configuration with a ground plane disposed between one or more radio planes and one or more digital planes. The ground plane shields the radio side of the circuit board from the digital side and the only openings in the ground plane are through vias for signals passed between the digital side and radio side. These through vias are appropriately filtered by methods known to those skilled in the art to prevent digital noise from disrupting the radio side circuits. The ground plane extends to all of the edges of the circuit board and contacts the card holder frame by conductive traces on both outer surfaces of the circuit board. The traces are located on the perimeter of each surface of the circuit board along three of the sides and are connected to the ground plane by a plurality of through vias. The traces come into contact with the card holder frame and card holder covers of the circuit board when the circuit board is locked in place and the covers are glued on with an electrically conductive adhesive or glue. The fourth side of the circuit board has the 68-pin connector and shielding on this side is provided when the circuit board contacts the card holder frame on the radio side of the circuit board by means of an electrically conductive metal rib that extends across the card holder frame parallel to the pin connector. The metal rib is used when there are no uninsulated circuits in the area where the rib contacts the surface of the radio side of the circuit board. When there are uninsulated circuits in this area, they must be insulated or the rib must be insulated or constructed, all or in part, of non-conductive materials. The rib is located on the inward side of the connector at a sufficient distance so that it does not interfere with the connections. When the circuit board is locked in place, the radio side of the circuit board contacts the rib and an electrically shielded compartment is formed around the radio side of the circuit board. In the same manner, an electrically shielded compartment is formed around the digital side of the circuit board.

Still another object of the present invention is to provide a heat sink for the dissipation of the heat generated by the circuit board devices. This has been a problem for typical prior art memory card holders that have been constructed using plastic frames and metal covers. These card holders were designed so that the metal covers provided shielding and the plastic frames thermally isolated the covers from the circuit board. This design created a problem for heat dissipation because the metal covers contained the heat inside the card holder housing and did not allow air to circulate freely through the housing, while the plastic frame prevented the heat from being effectively conducted to the metal covers on the outside of the housing where it could be dissipated. The card holder of the present invention is designed so that the ground plane, the traces, the metal frame and the metal covers of the card holder housing combine to act as a heat sink. Heat from the circuit board devices is conducted by means well known in the art of heat sinks through the ground plane traces to the card holder frame and the card holder covers. Thus, the entire card holder assembly effectively acts as a heat sink to maintain a safe working temperature for the circuit board and its component devices.

Other objects, features and advantages of the present invention will be apparent from the accompanying drawings and from the detailed description that follow below.

DETAILED DESCRIPTION OF THE INVENTION

As used in this specification, the definitions for the terms listed below are as follows:

PCMCIA Type II memory card—a communication card falling within the parameters of the standards established by the Personal Computer Memory Card International Association for Type II Memory Cards. This standard is hereby incorporated by reference herein.

Radio Frequency Interference (RFI)—any electrical signal capable of being propagated into and interfering with the proper operation of electrical or electronic equipment. The frequency range of such interference may be taken to include the entire electromagnetic spectrum.

Electrostatic Discharge (ESD)—the release of an electric charge stored on the surface of an insulated object to another object having a lower or opposite electrical charge.

Ground plane—a conductor layer, or portion of a conductor layer, used as a common reference point for circuit returns, shielding, or heat sinking.

Heat sink—a material capable of absorbing heat that dissipates carries away, or radiates into the surrounding atmosphere the heat generated within electronic components, such as transistors, integrated-circuit amplifiers, etc.

Via—a vertical conductor or conductive path forming the interconnection between multilayer hybrid circuit layers.

Bar-code scanner—An optical scanning device designed to read information printed in the form of bars of different size by detection and processing of the varying reflectivity of light in the bar code.

Spread spectrum transmission—a communication technique in which many different signal wave forms are transmitted in a wide band. Power is spread thinly over the band so narrow-band radios can operate within the wide band without interference.

Local-area network (LAN)—a data-communications system that allows similar or dissimilar digital devices to talk to each other over a common transmission medium. A local network provides such communications over a limited geographical area; distances can vary from a few hundred feet to several miles.

Edge connector—a one piece receptacle, containing female contacts, designed to interconnect and receive the edge of a printed-circuit board on which the male contacts are etched or printed.

Figure 1:
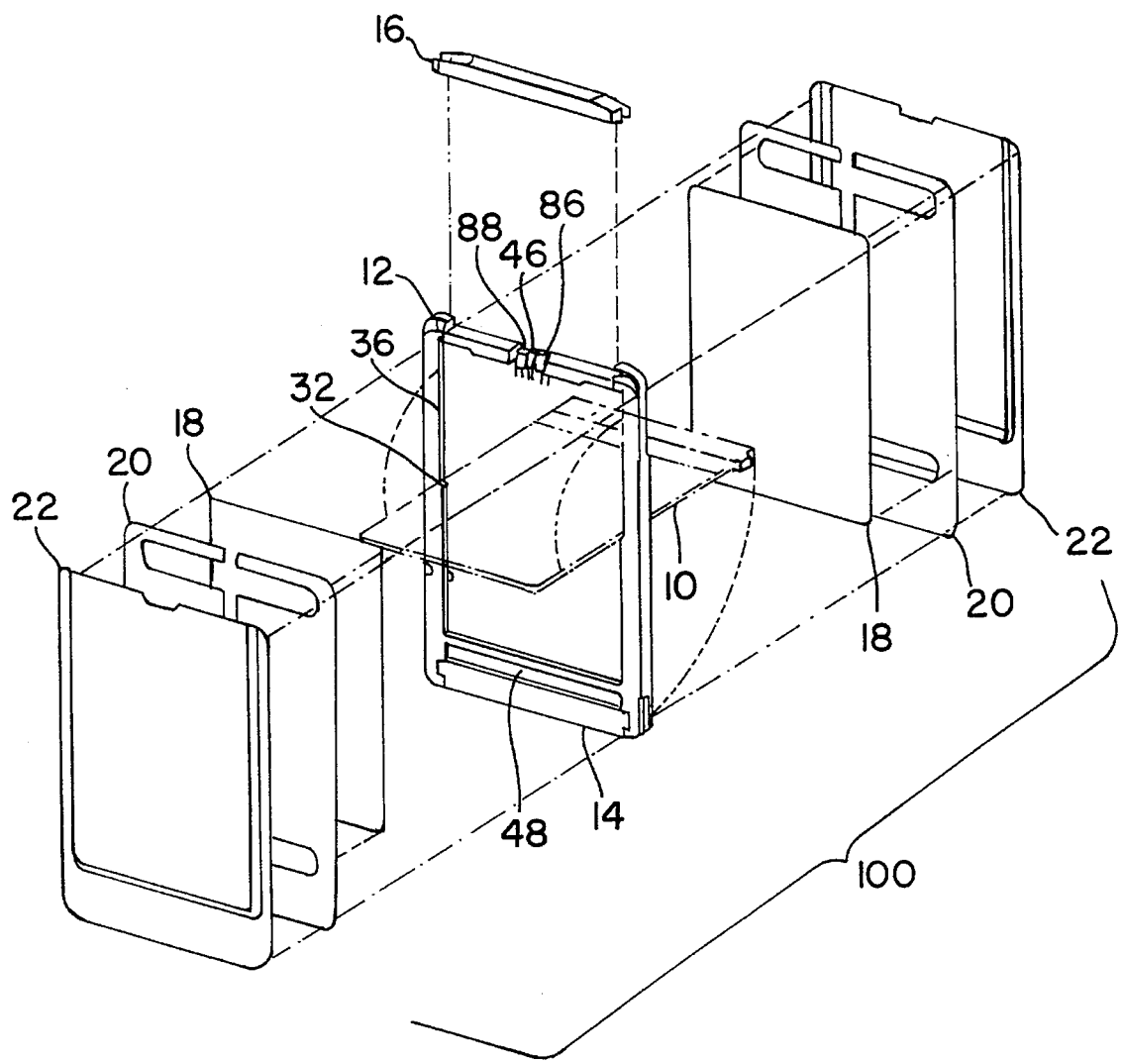
FIG. 1 is an exploded view of the memory card holder assembly showing the cover plates, insulating sheets and frame and the mounting of the circuit board and antenna.

The PCMCIA Type II memory card holder ("the card holder") of the present invention is designed to be inserted in a standard 68-pin PCMCIA Type II memory card plug. The PCMCIA standards are hereby incorporated by reference herein. Referring first to FIG. 1, the card holder assembly 100 includes a rectangular frame 12 having walls on three sides and a PCMCIA 68-pin connector 14 on the fourth side. However, this does not preclude the use of another suitable connector with the memory card holder. On the end opposing the connector 14, means are provided for mounting an antenna assembly 16 that is capable of housing up to two antennas. After the memory card circuit board 10 is mounted in the frame 12, the card holder assembly 100 is formed by sandwiching the card frame 12 between, in order from the frame outwards: a sheet of electrical insulating material 18 that extends to all of the edges of the circuit board 10; a layer of adhesive 20 for securing the insulating material 18 to an outer cover plate 22; and the cover plate 22 which is fastened to the card holder frame 12 by an electrically conductive adhesive, preferably a glue, applied along the perimeter on the inside of the cover plate. The cover plates 22 are constructed of an electrically and heat conductive material, preferably stainless steel.

Figure 2:
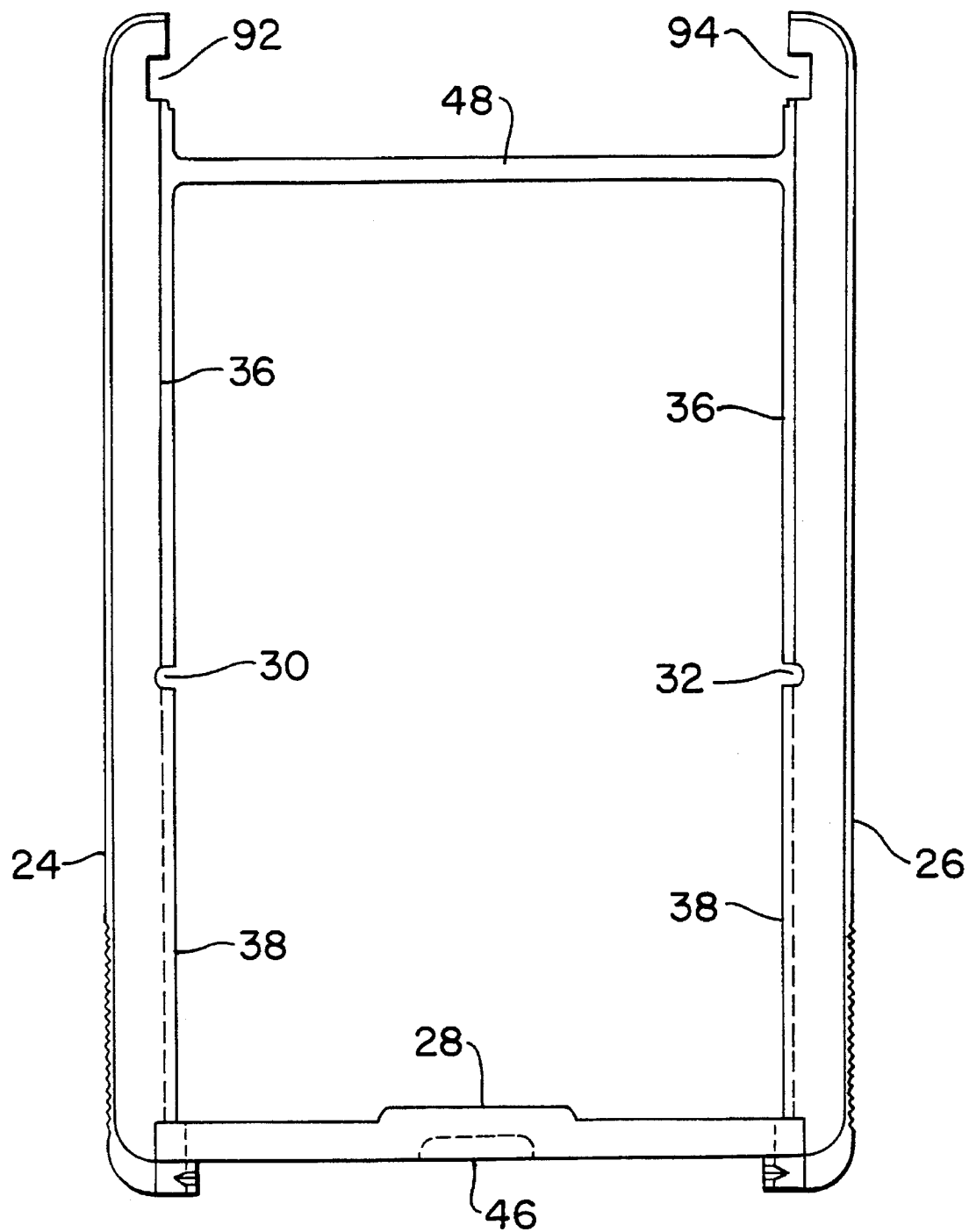
FIG. 2 is a plan view of the card holder frame and an elevation view of the closed mating header end of the frame.

FIG. 2 shows the card holder frame 12. The card holder frame 12, except for the connector, is made of both electrically and heat conductive materials and has a pair of parallel side rails 24 and 26 extending between a closed mating header 28 end and the connector end which is formed by the 68-pin connector 14. The preferred electrically and heat conductive material is a non-ferrous die cast metal and the most preferred is a die cast zinc. Each side rail 24 and 26 has a slot 30 and 32 located at about the mid-point of the side rail 24 and 26 on the inward side, facing the opposing side rail.

The closed mating header 28 joins the opposing side rails 24 and 26. In some embodiments of the present invention, the closed mating header 28 has an aperture 46 therein for signals to and from the circuit board 10. In the preferred embodiment, aperture 46 is used for connecting up to two radio antennas 86 and 88.

Figure 3A:
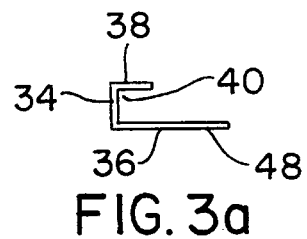
FIG. 3a shows a sectional view of one of the side rails of the card holder frame.
Figure 3B:
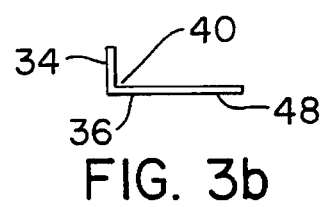
FIG. 3b shows a sectional view of one of the side rails of the card holder frame.
Figure 3:
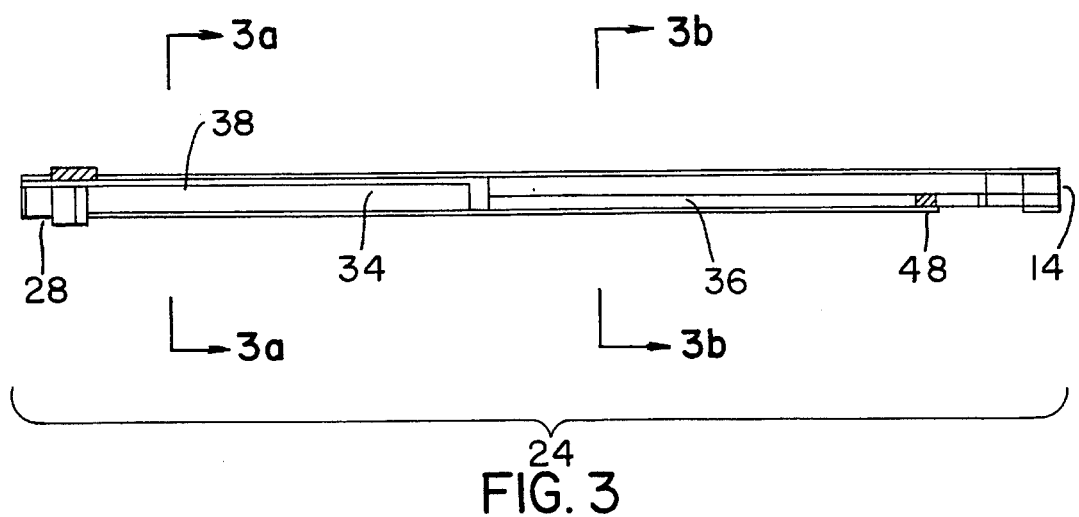
FIG. 3 is an elevation view of one of the side rails of the card holder frame depicting the sloping upper and lower walls of the side rail.

As shown in FIG. 3, each side rail 24 and 26 has a channel defined by: an outer wall 34; an inwardly directed lower wall 36 from the connector 14 end to the slot 30; and an inwardly directed upper wall 38 from the slot 30 to the closed mating header 28 end. The channel forms a recess 40 of a predetermined depth, the function thereof is defined hereinafter. The thickness of the lower wall 36 and the upper wall 38 are tapered so that the lower wall 36 is thicker at the connector 14 end than at the slot 30 end and the upper wall 38 is thicker at the slot 30 end than at the mating header 28 end. A rib 48 extends between the lower walls 36 of the opposing side rails 24 and 26 near the connector 14 end. FIG. 3a shows a sectional view of one of the side rails 24 on the mating header 28 end of the card holder frame 12 and FIG. 3b shows a sectional view of the same side rail 24 on the connector 14 end of the card holder frame 12.

Figure 4A:
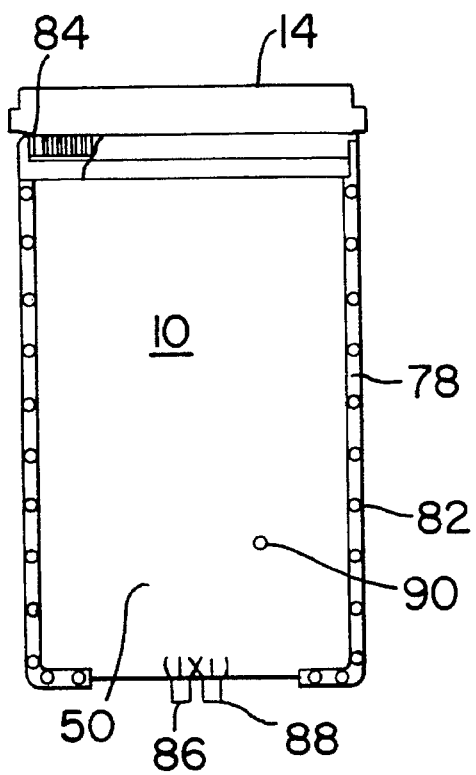
FIG. 4a is a plan view of the top surface and FIG. 4b is a plan view of the bottom surface of the circuit board.
Figure 4B:
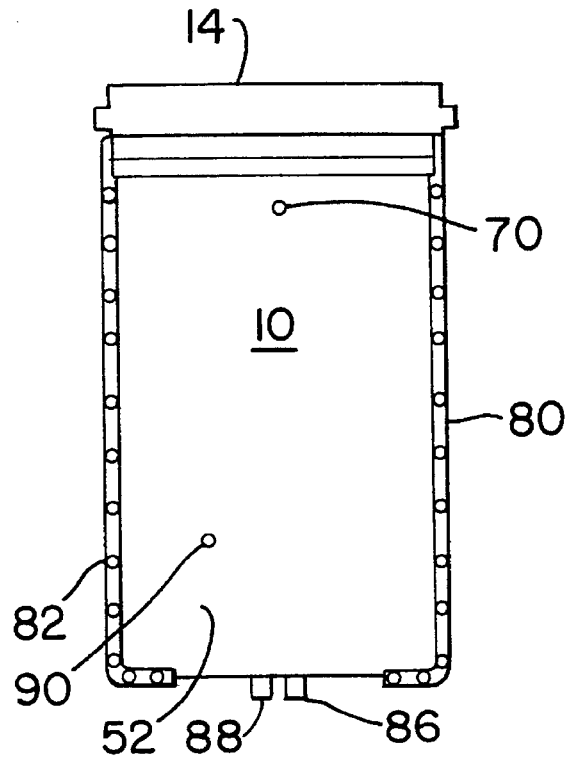

FIGS. 4a and 4b depict the circuit board which has an analog or radio side 50 (FIG. 4a) and a digital side 52 (FIG. 4b).

The 68-pin connector 14 mounts on one end of the board using well known edge connector methods, wherein the edge of the circuit board on the top and bottom surfaces has a plurality of printed or etched male connections 84. The opposing end of the circuit board 10 has connectors 86 and 88 for connecting up to two radio antennas 16. Variations of the design can be used for circuit boards having different functions and different circuit layer configurations.

Figure 5:
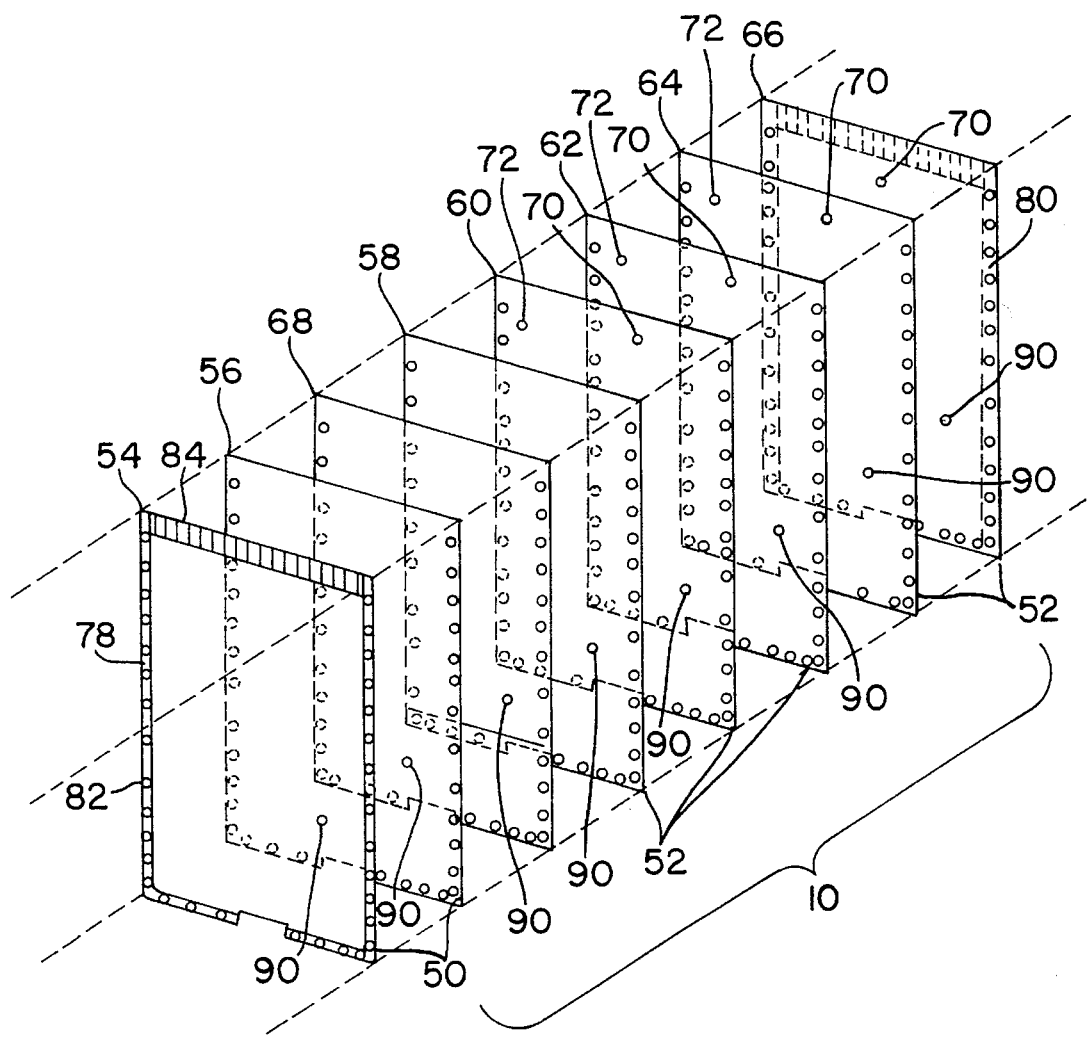
FIG. 5 is an exploded view of the circuit board depicting the multilayer construction and vias.

The circuit board 10 shown in FIG. 5 has a ground plane 68 disposed between at least one radio circuit plane 54 and at least one digital circuit plane 66. In the preferred embodiment of the present invention, the circuit board has a second radio circuit plane 56 and four additional digital planes 58, 60, 62 and 64. The radio circuit planes 54 and 56 and the digital circuit planes 58, 60, 62, 64 and 66 comprise the radio side 50 of the circuit board and the digital side 52 of the circuit board 10 respectively. These two sides are electrically shielded from each other by their location on either side of the ground plane 68 and by appropriately filtered vias through which inter-connection signals pass.

The locations of vias are determined when the multilayer circuit board is designed and the interconnections between the layers of circuit planes is established. Vias are made by drilling a hole in a circuit plane and plating the sides of the hole with a conductive metal. A via connects adjacent planes having corresponding holes in the same location. There are three specific types of vias. The type of via used depends on the location of the circuit planes that are being interconnected. A through via goes from one surface of the circuit board to the other surface. A plurality of through vias 82 (typical) are used in the present invention to connect the ground trace 78 on the radio surface 50 and the ground trace 80 on the digital surface 52 of the circuit board 10 with the ground plane 68. In other places, through vias 90 are used to connect surface radio circuit plane 54 with the opposing surface digital plane 66. Blind vias 70 typically connect one of the surface planes 66 with an interior plane or planes 60, 62, and 64 and stop within the circuit board 10 before passing through to the opposing surface plane. Buried vias 72 connect interior planes 60, 62, and 64 and do not penetrate either of the surface planes 54 and 66.

Electrical shielding is maintained by using blind 70 and buried 72 vias for signals passing between the planes on only one side of the ground plane 68. The sole exception to this is connections for signals between the radio side 50 and digital side 52 which must pass through the ground plane. These signals are transmitted in appropriately filtered through vias 90 that insure the minimal leakage of digital noise to the radio side 50 of the circuit board 10. These filtered through vias are important in order to reduce the digital noise so that it does not affect the radio circuits and their use is well known in the art.

The ground plane 68 extends to all edges of the radio and digital planes of the circuit board 10 and is connected to perimeter ground traces 78 and 80 that are located along the perimeter on three sides of both the top (digital plane 66) and bottom (radio plane 54) surfaces of the circuit board 10. The ground traces 78 and 80 are composed of an electrically conductive metal. Such metals are well known to those skilled in the art. The fourth side is the connector 14 end of the circuit board 10. The ground traces 78 and 80 can be either etched, printed or soldered to the circuit board 10 by means well known in the art. The novel mounting mechanism of the present invention provides continuous contact between the ground traces 78 and 80 on the circuit board 10 and the card holder frame 12 sufficient to conduct heat and ground the circuit board to the card holder.

The memory card holder assembly 100 is inserted in a computer or electronic device card plug by slotted means located on the outside of the side rails. The connector for the memory card holder is designed for insertion in a standard PCMCIA memory card plug and it therefore, conforms to the PCMCIA standards for such connectors. When the card holder is inserted in the PCMCIA plug, it grounds to the chassis of the computer or electronic device to provide a ground path. This same ground path is used to discharge any electrostatic charges that build up inside the card holder or are discharged to the card holder assembly 100 from external devices. Prior art PCMCIA card holders are typically constructed with plastic frames that do not permit the electrostatic charges on the circuit board to be directly discharged through the frame to the chassis ground of the mating device.

When the circuit board 10 is installed in the card holder frame 12, the surface of the analog side 50 of the circuit board 10 contacts the rib 48 in the card holder frame 12. The rib 48 is preferably constructed of the same electrically and heat conductive material as the other components of the card holder frame 12. Therefore, the portions of the circuit board 10 that the rib 48 contacts must either be devoid of circuits and components or insulated to protect the circuits from grounding to the card holder frame 12 and/or short circuiting.

In another embodiment of the present invention, where electrical circuits pass through the circuit board 10 in areas contacted by the rib 48, all or part of the rib 48 can be constructed of non-conductive material. This permits the rib 48 to contact circuits printed on the circuit board 10 without risk of grounding the signal or shorting the circuit. The preferred non-conductive material for the construction of the rib 48 is a plastic or a plastic insulated metal.

As shown in FIG. 1, the circuit board 10 is mounted in the card holder frame 12 by sliding it lengthwise through the frame with the radio side 50 disposed towards the connector 14 end and the circuit board connector end being above the upper plane of the card frame 12. The side edges of the circuit board pass through the side rail slots 30 and 32. When the circuit board 10 is about half way through the plane formed by the upper side of the card holder frame 12, the circuit board 10 is rotated about 90 degrees so that the circuit board end connector 14 rotates towards the connector end of the card holder frame 12 and the circuit board 10 is affixed in the side rail recesses 40. The ground traces 78 and 80 around the perimeter surfaces of the circuit board 10 are tightly and continuously contacted by the upper and lower walls 36 and 38 of the side rails 24 and 26 of the frame 12. The circuit board connector 14 inserts into slots 92 and 94 (FIG. 2) on the opposing side rails 24 and 26 or is mounted by other suitable mounting means known in the art. The insertion of the connector locks the circuit board 10 in place and creates both an electrically and heat conductive path between the ground traces 78 and 80 and the card holder frame 12. When the electrically conductive card holder contacts the chassis of the computer or electronic device, a ground connection between the card holder assembly 100 and the chassis is formed. This provides a common ground for the circuit board 10 and the other electronic devices in the chassis and avoids any signal disturbances caused by separate grounds.

When the circuit board 10 is mounted in the card holder frame 12, it is not parallel to the plane formed by the upper and lower surfaces of the frame side rails 24 and 26. Instead, it slopes upwardly from the connector 14 end of the card holder frame 12 to the mating header end 28. In relation to the parallel planes formed by the upper and lower surfaces of the card holder frame side rails 24 and 26, the slope is between about 0.1 degree and about 1.0 degree, with a preferred slope of about 0.3 degree. Sloping the circuit board 10 creates a greater clearance distance between the surface of the analog side of the circuit board 50 and the card holder cover 22 at the mating header 28 end than at the connector 14 end. Conversely, the digital side of the circuit board 52 has a greater clearance distance at the connector 14 end than at the mating header 28 end.

Sloping the circuit board 10 permits taller components to be mounted on the circuit board 10 than would be possible if the board was mounted in a plane parallel to the upper and lower surfaces of the card holder frame side rails 24 and 26. This is particularly important in PCMCIA memory card holders because of the spatial limitations. The sloped mounting of the circuit board 10 provides the advantage of permitting the use of a combination of taller analog and digital circuit board components than has been possible with typical PCMCIA memory cards holders.

While the invention has been described with reference to specific embodiments, the description is not meant to be construed in a limiting sense. Various modifications of the disclosed embodiments, as well as other embodiments of the invention, will be apparent to persons skilled in the art upon reference to this description. It is therefore, contemplated that the appended claims will cover any such modifications or embodiments as fall within the true scope of the invention.

What we claim is:

1. An electrically shielded and grounded, electrostatic discharge resistant memory card assembly comprising:

a memory card circuit board formed from a plurality of layers of circuit planes having a top surface and a bottom surface, all of the circuit planes on one side of a ground plane are digital circuits planes and all of the circuit planes on the opposing side of the ground plane are analog circuits planes; and a perimeter ground trace on three sides of each said surface and a connector on a fourth side, where the ground plane is disposed between said top and bottom surfaces;

a memory card holder comprising an open connector end, an opposing end having a closed mating header and a pair of side rails for slidably and rotatably receiving a memory card there between, said rails extending between the closed mating header end and the connector end to form a card holder frame having an inward side, an outward side, an upper surface and a lower surface, where each said rail has an inward transverse slot at about the midpoint and each rail is defined by an outer wall having an inwardly directed lower wall extending between said open connector end and said transverse slot and an inwardly directed upper wall between said transverse slot and said closed mating header, where each said lower wall is connected by a rib and where a lower joint between said outer wall and said inwardly directed lower wall is characterized by a recess extending a predetermined distance along said lower joint and an upper joint between said outer wall and said inwardly directed upper wall is characterized by a recess extending a predetermined distance along said upper joint; and a pair of cover plates disposed on either side of said card holder frame having an exterior surface and an interior surface and a raised central area extending from the exterior surface;

wherein said card holder frame and cover plates are constructed of electrically conductive and heat conductive materials and said memory card assembly is formed by mounting said memory card in said card holder so that said ground trace continuously contacts said lower and upper walls of said card frame and tightly contacting the cover plates on said upper surface and said lower surface of said card holder frame to form two electrically isolated compartments.

2. The memory card assembly of claim 1, wherein said memory card is a PCMCIA memory card.

3. The memory card assembly of claim 2, wherein, said analog circuits are radio communication circuits.

4. The memory card assembly of claim 3, wherein said analog circuits are spread spectrum radio circuits.

5. The memory card assembly of claim 4, wherein said closed mating header has an aperture.

6. The memory card assembly of claim 5, wherein, a layer of non-electrically conductive material extending to all edges of said circuit board is adhered to said interior surface of each said cover plate.

7. The memory card assembly of claim 6, wherein said card holder frame is a die cast metal, said cover plates are stainless steel and said electrically conductive adhesive is a conductive glue.

8. The memory card assembly of claim 7, wherein said lower walls of said side rails slope upwardly from said connector end to said transverse slot and said upper walls of said side rails slope upwardly from said transverse slot to said mating header.

9. The memory card assembly of claim 8, wherein said closed mating header has an aperture and an antenna is connected to said memory card holder on said outward side of said closed mating header.

10. The memory card assembly of claim 4, wherein said rib is electrically non-conductive.

11. The memory card assembly of claim 4, wherein said closed mating header has an aperture and an antenna is connected to said memory card holder on said outward side of said closed mating header.

12. The memory card assembly of claim 1, wherein said closed mating header has an aperture.

13. The memory card assembly of claim 12, wherein a layer of non-electrically conductive material extending to all edges of said circuit board is adhered to said interior surface of each said cover plate.

14. The memory card assembly of claim 13, wherein each said cover plate is secured to said upper and lower surfaces of said card holder frame by an electrically conductive adhesive.

15. The memory card assembly of claim 14, wherein said card holder frame is a die cast metal, said cover plates are stainless steel and said electrically conductive adhesive is a conductive glue.

16. The memory card assembly of claim 15, wherein said lower walls of said side rails slope upwardly from said connector end to said transverse slot and said upper walls of said side rails slope upwardly from said transverse slot to said mating header.

17. The memory card assembly of claim 16, wherein said closed mating header has an aperture and an antenna is connected to said memory card holder on said outward side of said closed mating header.

18. The memory card assembly of claim 1, wherein said rib is electrically non-conductive.

19. The memory card assembly of claim 1, wherein said lower walls of said side rails slope upwardly from said connector end to said transverse slot and said upper walls of said side rails slope upwardly from said transverse slot to said mating header.

20. The memory card assembly of claim 1, wherein said closed mating header has an aperture and an antenna is connected to said memory card holder on said outward side of said closed mating header.

21. An electrically shielded and grounded, electrostatic discharge resistant PCMCIA memory card holder comprising:

an open connector end for mounting a connector;

an opposing end having a closed mating header;

a pair of side rails for slidably and rotatably receiving a memory card there between, said rails extending between said closed mating header end and said connector end to form a card holder frame having an inward side, an outward side, an upper surface and a lower surface, where each said rail has an inward transverse slot at about the midpoint and each rail is defined by an outer wall having an inwardly directed lower wall extending between said open connector end and said transverse slot and an inwardly directed upper wall between said transverse slot and said closed mating header, where a lower joint between said outer wall and said inwardly directed lower wall is characterized by a recess extending a predetermined distance along said lower joint and an upper joint between said outer wall and said inwardly directed upper wall is characterized by a recess extending a predetermined distance along said upper joint;

a rib connecting said inward sides of said lower walls of said side rails; and a pair of cover plates disposed on either side of said card holder frame having an exterior surface, an interior surface and a raised central area extending from said exterior surface;

wherein said side rails, closed mating header, rib and cover plates are constructed of electrically conductive and heat conductive materials.

22. The memory card holder of claim 21, wherein said closed mating header has an aperture.

23. The memory card holder of claim 22, wherein said rib is constructed of non-electrically conductive material.

24. The memory card holder of claim 22, wherein a layer of non-electrically conductive material extending to all edges of said circuit board is adhered to said interior surface of said raised area of each said cover plate.

25. The memory card holder of claim 24, wherein each cover plate is secured to said upper and lower surfaces of said card holder frame by an electrically conductive adhesive.

26. The memory card holder of claim 25, wherein said card holder frame is a die cast metal, said covers plates are stainless steel and said electrically conductive adhesive is a conductive glue.

27. The memory card holder of claim 25, wherein said lower walls of said side rails slope upwardly from said connector end to said transverse slot and said upper walls of said side rails slope upwardly from said transverse slot to said mating header end.

28. The memory card holder of claim 27, wherein said closed mating header has an aperture and an antenna is connected to said memory card holder on said outward side of said closed mating header.

29. The memory card holder of claim 21, wherein said rib is constructed of non-electrically conductive material.

30. The memory card holder of claim 21, wherein a layer of non-electrically conductive material extending to all edges of said circuit board is adhered to said interior surface of said raised area of each said cover plate.

31. The memory card holder of claim 21, wherein each cover plate is secured to said upper and lower surfaces of said card holder frame by an electrically conductive adhesive.

32. The memory card holder of claim 31, wherein said card holder frame is a die cast metal, said covers plates are stainless steel and said electrically conductive adhesive is a conductive glue.

33. The memory card holder of claim 21, wherein said lower walls of said side rails slope upwardly from said connector end to said transverse slot and said upper walls of said side rails slope upwardly from said transverse slot to said mating header end.

34. The memory card holder of claim 21, wherein said closed mating header has an aperture and an antenna is connected to said memory card holder on said outward side of said closed mating header.

* * * * *